United States Patent
Seki et al.

(10) Patent No.: US 8,253,449 B2
(45) Date of Patent: Aug. 28, 2012

(54) CLOCK SWITCH CIRCUIT AND CLOCK SWITCH METHOD OF THE SAME

(75) Inventors: Hiroshi Seki, Yokohama (JP); Kiyoshi Kirino, Yokohama (JP)

(73) Assignee: Renesas Electronics Corporation, Kawasaki (JP)

( * ) Notice: Subject to any disclaimer, the term of this patent is extended or adjusted under 35 U.S.C. 154(b) by 274 days.

(21) Appl. No.: 12/787,687

(22) Filed: May 26, 2010

(65) Prior Publication Data

US 2010/0308874 A1 Dec. 9, 2010

(30) Foreign Application Priority Data

Jun. 4, 2009 (JP) ................................. 2009-134884

(51) Int. Cl.
*H03K 21/00* (2006.01)
*H03K 23/00* (2006.01)
*H03K 25/00* (2006.01)

(52) U.S. Cl. ........................................ 327/115; 327/117

(58) Field of Classification Search .................. 327/115, 327/117

See application file for complete search history.

(56) References Cited

FOREIGN PATENT DOCUMENTS

JP 2008-123402 A 5/2008

*Primary Examiner* — Lincoln Donovan
*Assistant Examiner* — Daniel Rojas
(74) *Attorney, Agent, or Firm* — Sughrue Mion, PLLC

(57) ABSTRACT

A clock switch circuit includes a frequency divide circuit which divides a frequency of a basic clock to generate a plurality of frequency-divided clocks, an output select signal generation circuit which outputs an output select signal according to a clock select signal, and an output select circuit which switches a clock to be output according to the output select signal, in which the frequency divide circuit outputs a plurality of frequency-divided count values indicating the number of clocks of the basic clock from start of one cycle of each of the frequency-divided clocks, and the output select signal generation circuit switches a value of the output select signal at timings at which start timings of cycles of frequency-divided clocks before and after switch operation are matched based on a frequency-divided count value corresponding to a current selection clock among the plurality of frequency-divided count values.

11 Claims, 12 Drawing Sheets

CLOCK SWITCH CIRCUIT AND CLOCK SWITCH METHOD OF THE SAME

INCORPORATION BY REFERENCE

This application is based upon and claims the benefit of priority from Japanese patent application No. 2009-134884, filed on Jun. 4, 2009, the disclosure of which is incorporated herein in its entirety by reference.

BACKGROUND

1. Field of the Invention

The present invention relates to a clock switch circuit and a clock switch method of the same, and more particularly, to a clock switch circuit and a clock switch method of the same that switch a plurality of frequency-divided clocks obtained by dividing a frequency of a basic clock according to a clock select signal.

2. Description of Related Art

In recent years, the speed of the operation frequency has been significantly increased in a field of a system LSI (Large Scale Integration circuit), and especially in a field of a system LSI mounted on a mobile device. There is an increasing demand of low power consumption in the system LSI used for such an application. In the system LSI, low power consumption is realized by switching clock frequencies according to the operation state. It is required to dynamically switch clocks from high frequency to low frequency while keeping the pulse width before and after switching of clock frequencies to ensure the normal system operation.

One example of the clock switch circuit is disclosed in Japanese Unexamined Patent Application Publication No. 2008-123402. Japanese Unexamined Patent Application Publication No. 2008-123402 discloses a variable clock generation circuit corresponding to the clock switch circuit. The variable clock generation circuit includes a frequency dividing decoder and a next state storage flip-flop. The frequency dividing decoder 11 receives a state (S5) and a frequency select signal (S3), and decodes the state (S5) based on S3 and S5 to generate a next state (S6). The next state storage flip-flop latches the next state (S6) by an input clock (S1) to generate the new state (S5). The frequency dividing decoder 11 and the next state storage flip-flop constitute a sequential circuit having a plurality of states (S5). The next state storage flip-flop outputs one bit of the new state (S5) that is generated by latching the next state (S6) as a frequency-divided clock (S4).

Further, in the variable clock generation circuit, the frequency dividing decoder includes a plurality of divided state decoding units corresponding to the plurality of divided frequencies. In the frequency dividing decoder, a plurality of divided state decoding units are used by being switched based on the frequency select signal, so as to switch the frequency of the frequency-divided clock that is to be output. Thus, in the variable clock generation circuit, the frequency-divided clock having a given divided frequency can be output. Further, the frequency dividing decoder includes an idle state decode unit, and outputs the output of the idle state decode unit as the next state (S6) in switching the frequency-divided clock that is to be output, so as to prevent a glitch that is produced in switching the divided frequency of the frequency-divided clock. The symbols shown in parentheses in the above description correspond to those shown in FIG. 1 of Japanese Unexamined Patent Application Publication No. 2008-123402.

SUMMARY

However, the variable clock generation circuit disclosed in Japanese Unexamined Patent Application Publication No. 2008-123402 requires decoding for every one clock of the frequency-divided clock that is output. Since this decoding is not suitable for high-speed operation, clocks having high frequencies cannot be generated as the frequency-divided clock in the variable clock generation circuit disclosed in Japanese Unexamined Patent Application Publication No. 2008-123402.

A first exemplary aspect of the present invention is a clock switch circuit including a frequency divide circuit which divides a frequency of a basic clock to generate a plurality of frequency-divided clocks having different frequency dividing ratios, an output select signal generation circuit which outputs an output select signal according to a clock select signal having a value indicating a clock which is to be output, the output select signal specifying any one of a plurality of clocks including the plurality of frequency-divided clocks and the basic clock, and an output select circuit which selects any one of the plurality of clocks according to the output select signal to output the selected clock, in which the frequency divide circuit outputs a plurality of frequency-divided count values corresponding to each of the plurality of frequency-divided clocks, the plurality of frequency-divided count values indicating the number of clocks of the basic clock from start of one cycle of each of the frequency-divided clocks, and the output select signal generation circuit switches a value of the output select signal to a value corresponding to the clock select signal at a timing at which start timing of a cycle of a frequency-divided clock selected as a next selection clock matches start timing of a cycle of a frequency-divided clock corresponding to a current selection clock based on a frequency-divided count value corresponding to the current selection clock among the plurality of frequency-divided count values.

A second exemplary aspect of the present invention is a clock switch method of a clock switch circuit, the clock switch circuit outputting clock signals having different cycles by switching the clock signals, the method including generating a plurality of frequency-divided clocks having different frequency dividing ratios based on a basic clock, generating a plurality of frequency-divided count values indicating the number of clocks of the basic clock from a start point of one cycle of each of the plurality of frequency-divided clocks, detecting one of end timing and start timing of a cycle of a current selection clock based on a frequency-divided count value corresponding to the current selection clock among the plurality of frequency-divided count values, and switching a clock which is output to a clock having a different cycle at a timing at which start timing of a cycle of the frequency-divided clock selected as a next selection clock matches start timing of a next cycle of a frequency-divided clock corresponding to the current selection clock.

According to the clock switch circuit and the clock switch method of the same of the present invention, the plurality of frequency-divided clocks having different cycles are generated by the frequency divide circuit without performing complicated processing such as decoding. In summary, according to the clock switch circuit and the clock switch method of the same of the present invention, it is possible to generate the frequency-divided clocks having higher frequencies than generating the frequency-divided clocks by decoding. Further, in switching the clock to a frequency-divided clock having a different cycle, the start timing of the next selection clock is set based on the frequency-divided count value of the frequency-divided clock output as the current selection clock. Hence, according to the clock switch circuit and the clock switch method of the same of the present invention, any frequency-divided clock can be output at a timing at which the clock is switched without producing a glitch.

According to the clock switch circuit and the clock switch method of the same of the present invention, it is possible to deal with switching of clocks having higher frequencies while selecting any desired divided frequency without producing a glitch in switching clock frequencies.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

[First Exemplary Embodiment]

Figure 1:
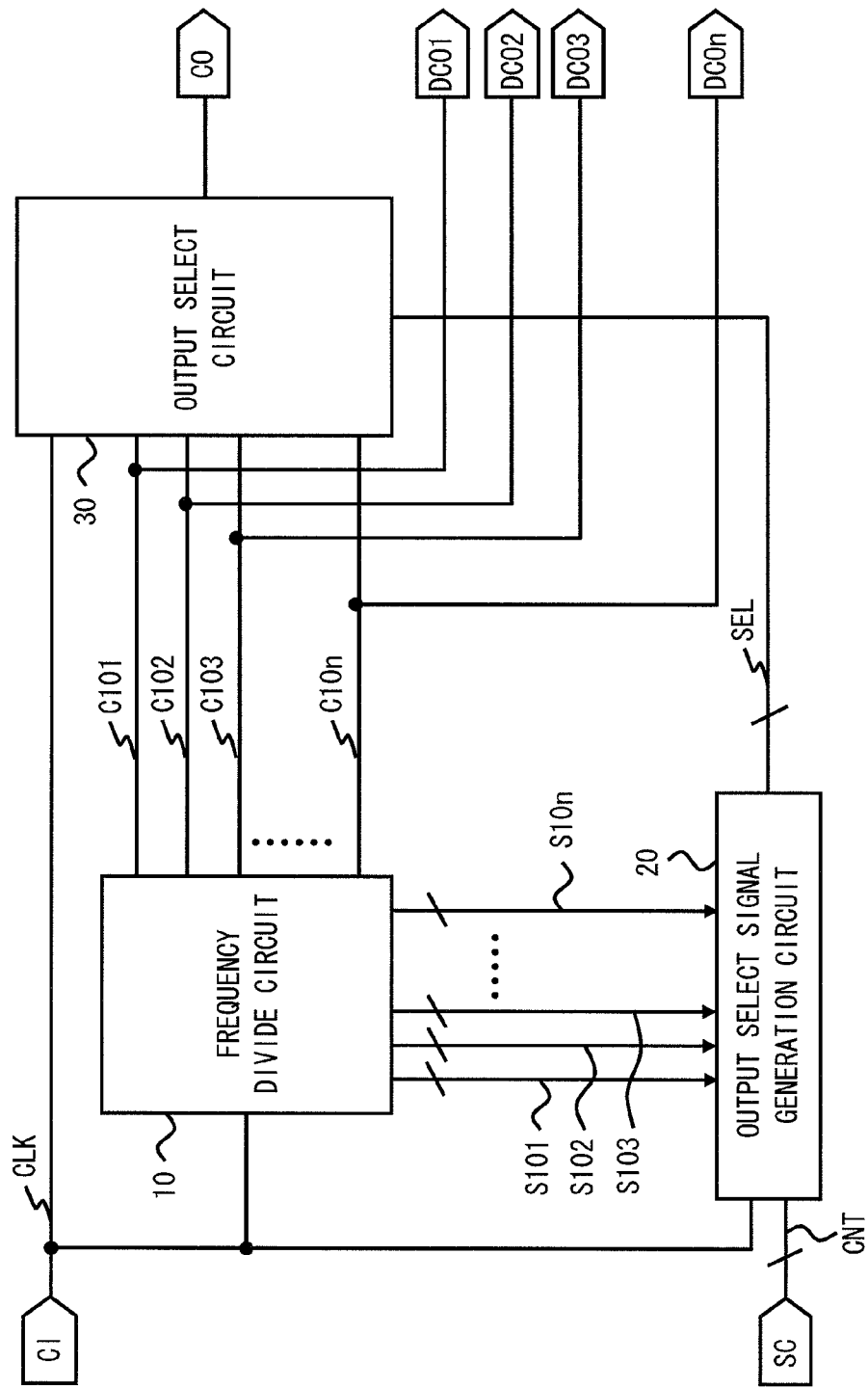
FIG. 1 is a block diagram showing a clock switch circuit according to a first exemplary embodiment.

Hereinafter, specific exemplary embodiments of the present invention will be described with reference to the drawings. FIG. 1 shows a block diagram showing a clock switch circuit 1 according to a first exemplary embodiment. As shown in FIG. 1, the clock switch circuit 1 includes a frequency divide circuit 10, an output select signal generation circuit 20, and an output select circuit 30. The clock switch circuit 1 further includes input terminals CI, SC, and output terminals CO, DCO1 to DCOn. The input terminal CI is a terminal that inputs a basic clock CLK, the input terminal SC is a terminal that inputs a clock select signal CNT, the output terminal CO is a terminal which outputs an output signal OUT, and output terminals DCO1 to DCOn are output terminals which are provided corresponding to n (n is a positive integer indicating the number of frequency-divided clocks, hereinafter the same) frequency-divided clocks. These terminals are connected to other circuits that are not shown.

The frequency divide circuit 10 divides a frequency of the basic clock CLK to generate a plurality of frequency-divided clocks having different frequency dividing ratios (C101 to C10n shown in FIG. 1). Further, the frequency divide circuit 10 outputs a plurality of frequency-divided count values S101 to S10n corresponding to each of the plurality of frequency-divided clocks C101 to C10n, the frequency-divided count values S101 to S10n indicating the number of clocks of the basic clock CLK from start of one cycle of each of the frequency-divided clocks. The frequency divide circuit 10 will be described hereinafter in detail.

The output select signal generation circuit 20 outputs an output select signal SEL that specifies any one of a plurality of clocks including the plurality of frequency-divided clocks C101 to C10n and the basic clock CLK according to the clock select signal CNT having a value that indicates a clock that is to be output. At this time, the output select signal generation circuit 20 switches the value of the output select signal SEL to the value corresponding to the clock select signal CNT at a timing at which start timing of a cycle of the next selection clock (frequency-divided clock selected as the clock selected as the next output signal based on the clock select signal) matches start timing of the next cycle of the frequency-divided clock corresponding to the current selection clock based on the frequency-divided count value corresponding to the current selection clock (frequency-divided clock output as the output signal OUT) among the plurality of frequency-divided count values S101 to S10n. In the first exemplary embodiment, the output select signal generation circuit 20 detects the start timing of the cycle of the current selection clock based on the frequency-divided count value corresponding to the current selection clock.

The output select circuit 30 selects any one of the plurality of clocks according to the output select signal SEL to output the selected clock as the output signal OUT. This plurality of clocks include the plurality of frequency-divided clocks C101 to C10n and the basic clock CLK.

Figure 2:
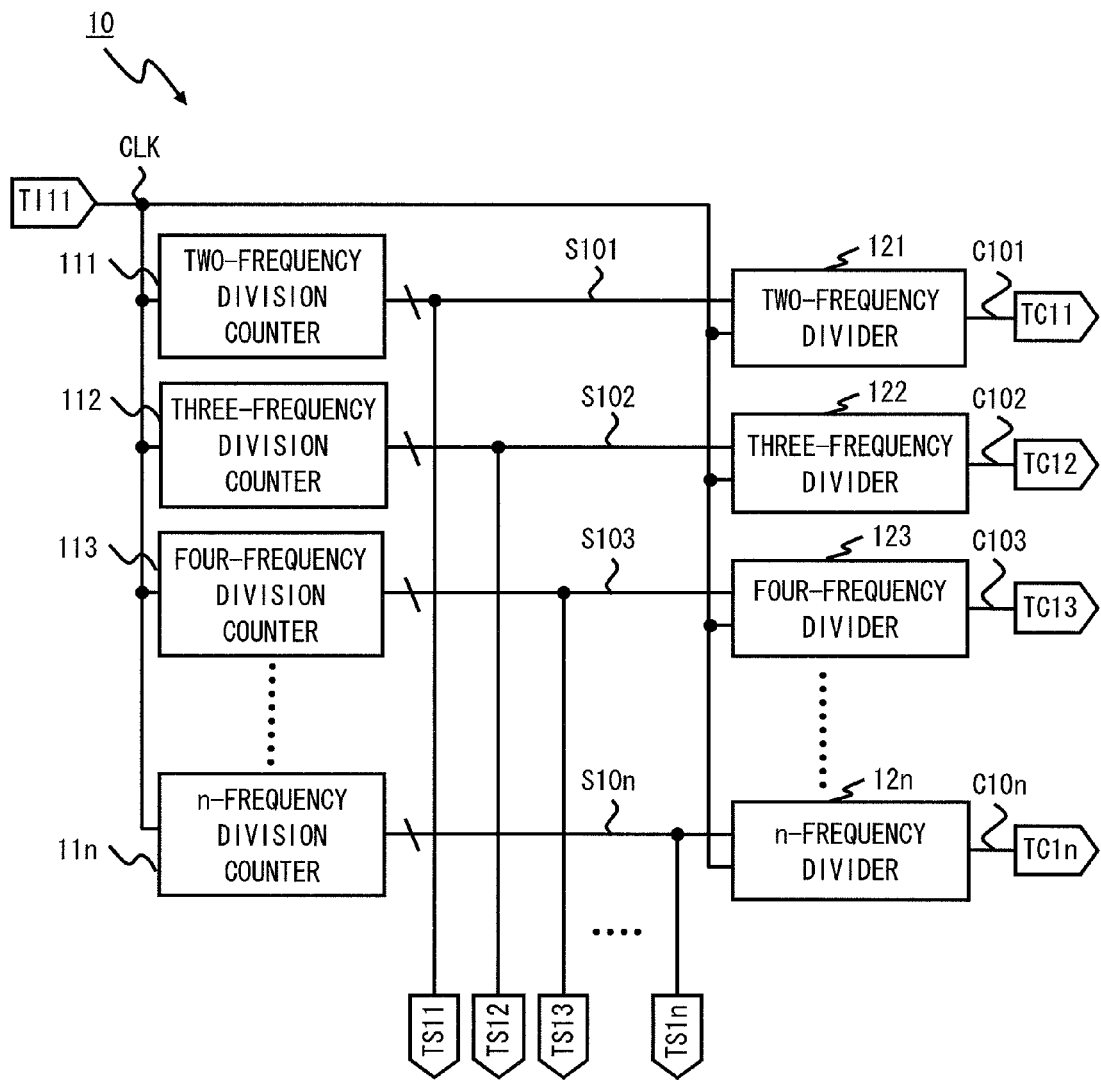
FIG. 2 is a block diagram showing a frequency divide circuit according to the first exemplary embodiment.

Next, the detail of the frequency divide circuit 10 will be described. FIG. 2 shows a block diagram of the frequency divide circuit 10. As shown in FIG. 2, the frequency divide circuit 10 includes a plurality of frequency division counters 111 to 11n and a plurality of frequency dividers 121 to 12n. The plurality of frequency division counters 111 to 11n each counts the basic clock and generate the frequency-divided count values S101 to S10n of the corresponding frequency-divided clocks. Each of these frequency division counters has a minimum count value and a maximum count value based on a frequency dividing ratio of the corresponding frequency-divided clock, and cyclically increases the frequency-divided count values S101 to S10n between a minimum count value and a maximum count value.

The plurality of frequency dividers 121 to 12n generate the frequency-divided clocks C101 to C10n based on the frequency-divided count value output from the corresponding frequency division counter among the plurality of frequency division counters 111 to 11n. The frequency dividers 121 to 12n according to the first exemplary embodiment operate based on the frequency-divided count values and the basic clock CLK. At this time, in the frequency divide circuit 10, the frequency division counters 111 to 11n count the number of clocks of the basic clock CLK to update the frequency-divided count values. When the frequency-divided count values becomes zero according to the input of a basic clock CLK, the frequency dividers 121 to 12n set the logic level of the frequency-divided clocks C101 to C10n to high level according to a basic clock CLK input next to the basic clock CLK. The frequency dividers 121 to 12n then refer to the frequency-divided count values every time the basic clock CLK is input based on the frequency dividing ratios of the frequency dividers 121 to 12n, so as to transit the values of the frequency-divided clocks C101 to C10n.

In the frequency divide circuit 10 according to the first exemplary embodiment, the frequency division counter (two-frequency division counter) 111 and the frequency divider (two-frequency divider) 121 are provided corresponding to a two-frequency-divided clock C101 having a cycle twice longer than that of the basic clock CLK. The frequency division counter (three-frequency division counter) 112 and the frequency divider (three-frequency divider) 122 are provided corresponding to a three-frequency-divided clock C102 having a cycle three times longer than that of the basic clock CLK. A frequency division counter (four-frequency division counter) 113 and a frequency divider (four-frequency divider) 123 are provided corresponding to a four-frequency-divided clock C103 having a cycle that is four times longer than that of the basic clock CLK. A frequency division counter (n frequency division counter) 11n and a frequency divider (n-frequency divider) 12n are provided corresponding to an n-frequency-divided clock C10n having a cycle that is n times longer than that of the basic clock CLK. Although the example of the frequency divide circuit 10 which generates n frequency-divided clocks is shown with reference to FIG. 2, the factor with respect to the basic clock CLK of the frequency-divided clock can be set as desired.

Further, the frequency divide circuit 10 shown in FIG. 2 includes an input terminal TI11, and output terminals TS11 to TS1n and TC11 to TC1n. The input terminal TI11 is a terminal that inputs the basic clock CLK. The output terminals TS11 to TS1n are terminals that output the frequency-divided count values S101 to S10n. The output terminals TC11 to TC1n are terminals that output the frequency-divided clocks C101 to C10n. Although the input/output terminals of the frequency divide circuit 10 are shown in FIG. 2 for the purpose of convenience, they may be omitted.

Figure 3:
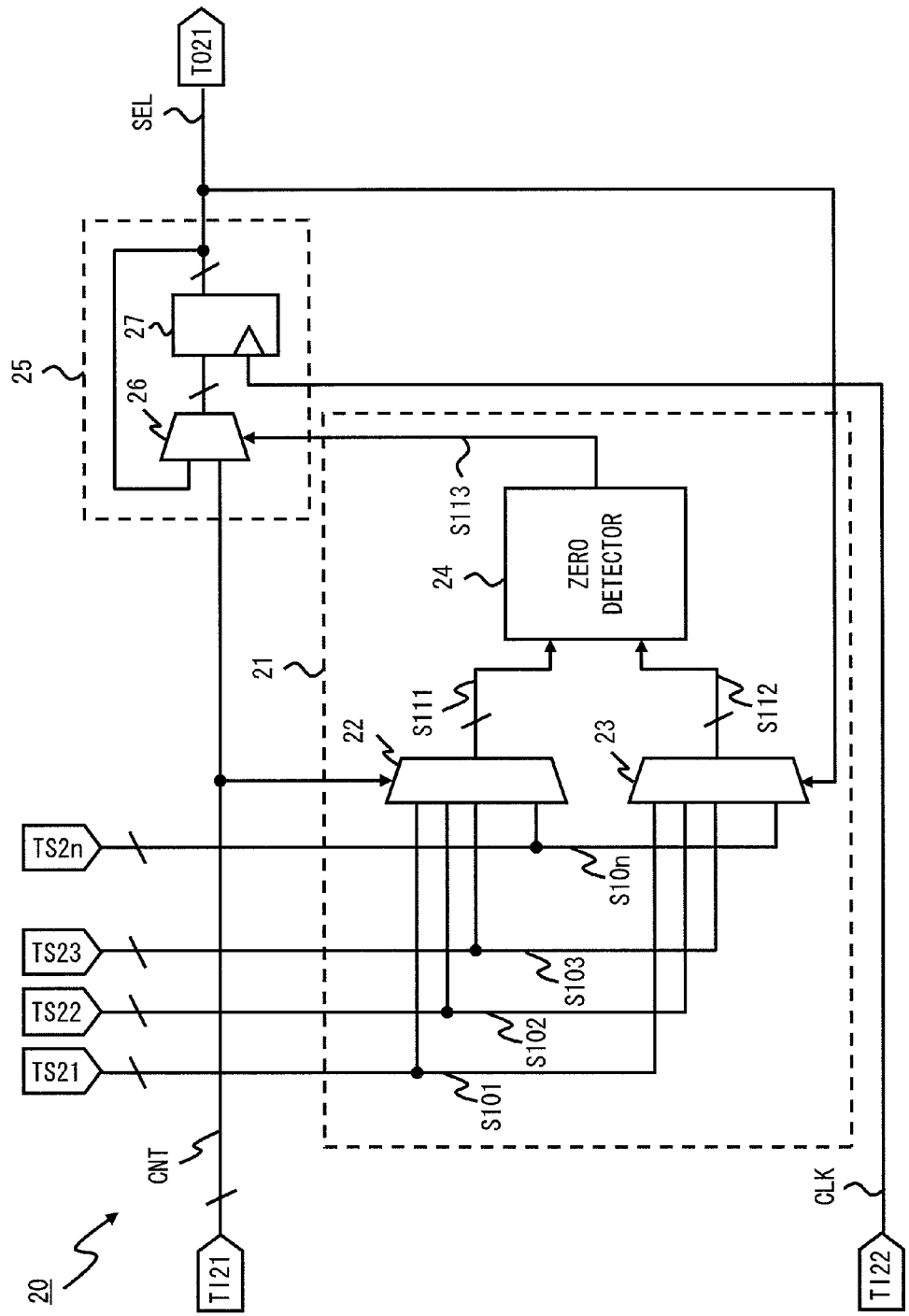
FIG. 3 is a block diagram showing an output select signal generation circuit according to the first exemplary embodiment.

Next, the detail of the output select signal generation circuit 20 will be described. FIG. 3 shows a block diagram of the output select signal generation circuit 20. As shown in FIG. 3, the output select signal generation circuit 20 includes a switch timing detection circuit 21 and an output select signal switch circuit 25. The switch timing detection circuit 21 outputs (or asserts) a timing notification signal S113 at a timing at which the start timing of the current selection clock matches the start timing of the next selection clock based on the frequency-divided count value of the current selection clock and the frequency-divided count value of the next selection clock. Further, the output select signal switch circuit 25 switches the value of the output select signal based on the timing notification signal S113.

In the first exemplary embodiment, the switch timing detection circuit 21 includes selectors 22 and 23, and a zero detector 24. The selector 22 is supplied with the clock select signal CNT as a select signal, and the frequency-divided count values S101 to S10n as the input signals. The frequency-divided count values S101 to S10n are output from the frequency divide circuit 10. The selector 22 selects the frequency-divided count value corresponding to the next selection clock supplied from the clock select signal CNT and outputs the selected value as the next cycle count value S111. The selector 23 receives the output select signal SEL as the select signal, and receives the frequency-divided count values S101 to S10n as the input signals. These frequency-divided count values S101 to S10n are output from the frequency divide circuit 10. The selector 23 selects the frequency-divided count value corresponding to the current selection clock supplied from the output select signal SEL and outputs the selected value as the current cycle count value S112. The zero detector 24 asserts the timing notification signal S113 upon detection that both of the next cycle count value S111 and the current cycle count value S112 are zero (minimum count value of the frequency-divided count value, for example). The zero detector 24 negates the timing notification signal S113 when any one of the next cycle count value S111 and the current cycle count value S112 is other than zero.

The output select signal switch circuit 25 includes a selector 26 and a flip-flop circuit 27. The selector 26 has one input terminal to which the clock select signal CNT is input, and the other input terminal to which the output select signal SEL is input. The selector 26 is supplied with the timing notification signal S113 as the select signal. The selector 26 outputs the clock select signal CNT during the period at which the timing notification signal S113 is asserted, and outputs the output select signal SEL during the time at which the timing notification signal S113 is negated. The flip-flop circuit 27 receives the value of the signal output from the selector 26 in synchronization with the rising edge of the basic clock CLK and outputs the received value as the output select signal SEL. When the clock select signal CNT specifies the frequency-divided clock having a different cycle as the clock signal that should be output in the next cycle, the output select signal switch circuit 25 asserts the timing notification signal S113 at a timing at which the start timing of the frequency-divided clock selected as the current selection clock matches the start timing of the frequency-divided clock selected as the next selection clock. The output select signal switch circuit 25 then outputs the value indicating the frequency-divided clock that should be output to the flip-flop circuit 27 in the next cycle as the output select signal SEL based on the assert of the timing notification signal S113.

The output select signal generation circuit 20 shown in FIG. 3 includes input terminals TI21, TI22, TS21 to TS2n, and an output terminal TO21. The input terminal TI21 is a terminal that inputs the clock select signal CNT. The input terminal TI22 is a terminal that inputs the basic clock CLK. The input terminals TS21 to TS2n are terminals that input the frequency-divided count values S101 to S10n. The output terminal TO21 is an output terminal of the output select signal SEL. Although the input/output terminals of the output select signal generation circuit 20 are shown in FIG. 3 for the purpose of convenience, they may be omitted.

Figure 4:
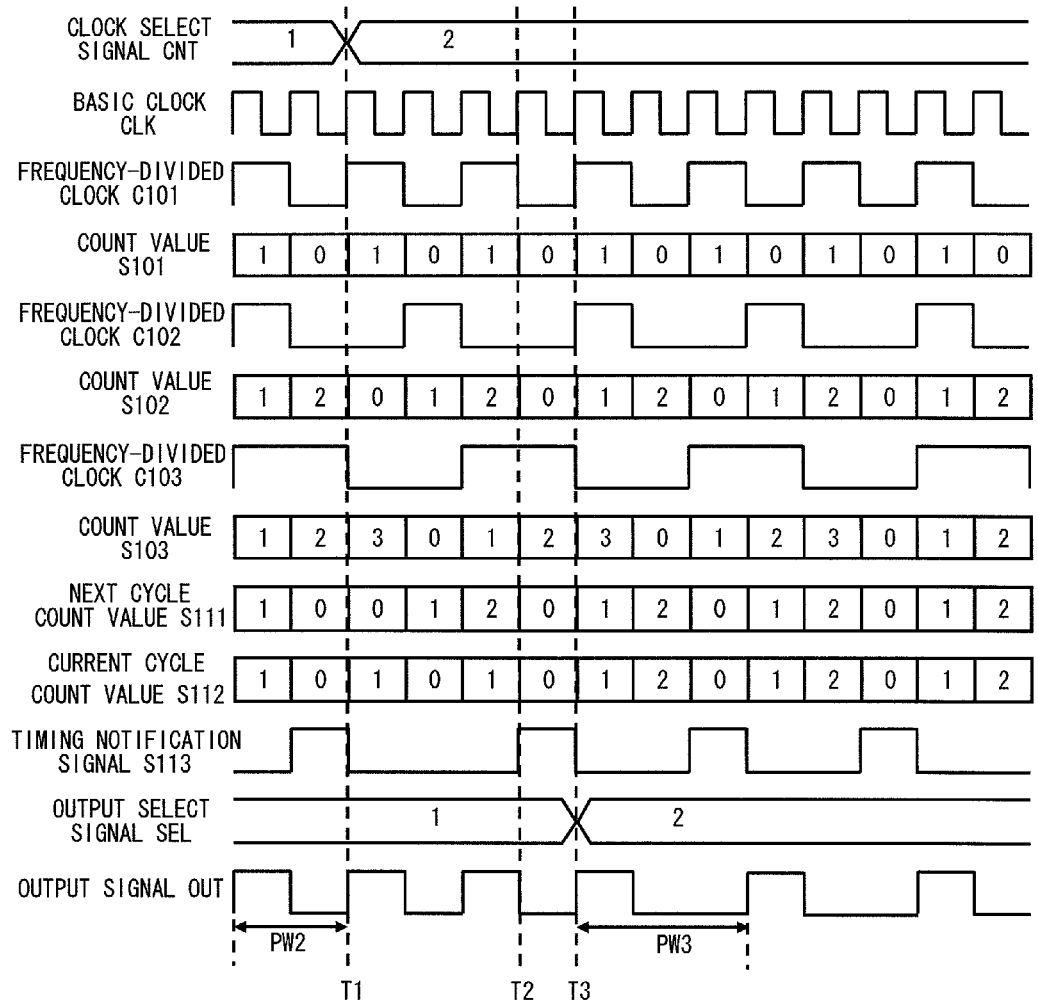
FIG. 4 is a timing chart showing the operation of a clock switch circuit according to the first exemplary embodiment.

Now, the operation of the clock switch circuit 1 according to the first exemplary embodiment will be described. FIG. 4 shows a timing chart showing the operation of the clock switch circuit 1. In the example shown in FIG. 4, the value of the clock select signal CNT is switched at timing T1, and the cycle of the frequency-divided clock output as the output signal OUT is switched at timing T3. Further, as shown in FIG. 4, the two-frequency division counter 111 outputs the two-frequency-divided count value S101 in which the minimum count value is zero and the maximum count value is one. The two-frequency divider 121 raises the logic level of the two-frequency-divided clock C101 in the basic clock CLK next to the clock at which the two-frequency-divided count value S101 becomes zero, and lowers the logic level of the two-frequency-divided clock C101 in the basic clock CLK next to the clock at which the two-frequency-divided count value S101 becomes one. The three-frequency division counter 112 outputs the three-frequency-divided count value S102 in which a minimum count value is zero and a maximum count value is two. The three-frequency dividers 122 raises the logic level of the three-frequency-divided clock C102 in the basic clock CLK next to the clock at which the three-frequency-divided count value S102 becomes zero, lowers the logic level of the three-frequency-divided clock C102 in the basic clock CLK next to the clock at which the three-frequency-divided count value S102 becomes one, and keeps the previous logic level (low level, for example) of the three-frequency-divided clock C102 in the basic clock CLK next to the clock at which the three-frequency-divided count value S102 becomes two. The four-frequency division counter 113 outputs a four-frequency-divided count value S103 in which a minimum count value is zero and a maximum count value is three. The four-frequency divider 123 raises the logic level of the four-frequency-divided clock C103 in the basic clock CLK next to the clock at which the four-frequency-divided count value S103 becomes zero, keeps the previous logic level (high level, for example) of the four-frequency-divided clock C103 in the basic clock CLK next to the clock at which the four-frequency-divided count value S103 becomes one, lowers the logic level of the four-frequency-divided clock C103 in the basic clock CLK next to the clock at which the four-frequency-divided count value S103 becomes two, and keeps the previous logic level (low level, for example) of the four-frequency-divided clock C103 in the basic clock CLK next to the clock at which the four-frequency-divided count value S103 becomes three. In FIG. 4, the signals regarding the n-frequency-divided clock C10n are omitted.

In the example shown in FIG. 4, the value of the clock select signal CNT is one before timing T1, and the two-frequency-divided clock C101 is selected as the current selection clock. Thus, the selector 22 shown in FIG. 3 outputs the frequency-divided count value S101 corresponding to the two-frequency-divided clock C101 as the next cycle count value S111, and the selector 23 outputs the two-frequency-divided count value S101 corresponding to the two-frequency-divided clock C101 as the current cycle count value S112. Thus, before timing T1, the timing notification signal S113 is asserted at a timing at which the two-frequency-divided count value becomes zero. Before timing T1, both of the current selection clock and the next selection clock are two-frequency-divided clock C101. Thus, there is no change in the output select signal SEL due to the assert of the timing notification signal S113.

At timing T1, the value shown by the clock select signal CNT is switched from one to two. Thus, switching of the output signal OUT from the two-frequency-divided clock C101 to the three-frequency-divided clock C102 is instructed to the clock switch circuit 1. According to the switch of the clock select signal CNT, the selector 22 outputs the three-frequency-divided count value S102 corresponding to the three-frequency-divided clock C102 as the next cycle count value S111. On the other hand, as the value of the output select signal SEL is not switched, the selector 23 continues to output the two-frequency-divided count value S101 corresponding to the two-frequency-divided clock C101 as the current cycle count value S112.

Next, at timing T2 to T3, the next cycle count value S111 and the current cycle count value S112 are zero. Thus, the zero detector 24 asserts the timing notification signal S113 at timing T2 to T3. Since the timing notification signal S113 is asserted, the selector 26 shown in FIG. 3 selects the clock select signal CNT and transmits the signal to the flip-flop circuit 27. At timing T3 where the basic clock CLK is raised, the value of the clock select signal CNT is received by the flip-flop circuit 27, and the value of the output select signal SEL is switched. According to the switch of the value of the output select signal SEL, the output select circuit 30 switches the clock signal output as the output signal OUT from the two-frequency-divided clock C101 to the three-frequency-divided clock C102. In the example shown in FIG. 4, before T3, one cycle of the output signal OUT corresponds to PW2, which is twice as long as one cycle of the basic clock CLK. After timing T3, one cycle of the output signal OUT corresponds to PW3, which is three times as long as one cycle of the basic clock.

From the above description, it is understood that, in the clock switch circuit 1 according to the first exemplary embodiment, the frequency-divided clocks C101 to C10n obtained by dividing the frequency of the basic clock CLK are generated by the frequency divide circuit 10, thereby increasing the frequencies of the frequency-divided clocks C101 to C10n without calculation processing such as decoding and the like. Thus, the clock switch circuit 1 can be used also in the recent high-speed system LSI.

Further, the clock switch circuit 1 generates the plurality of frequency-divided clocks having a cycle of an integer fraction of the basic clock CLK based on the frequency-divided count value increased or circulated by an integer. In summary, in the clock switch circuit 1, the cycle of the output signal OUT can be switched arbitrarily in a cycle of an integer fraction of the basic clock CLK.

The frequency divide circuit 10 of the clock switch circuit 1 generates the frequency-divided count values S101 to S10n indicating the number of clocks of the basic clock CLK from start of one cycle of each of the frequency-divided clocks C101 to C10n. The output select signal generation circuit 20 switches the value of the output select signal SEL at a timing at which the start timing of the cycle of the frequency-divided clock selected as the next selection clock matches the start timing of the frequency-divided clock corresponding to the current selection clock based on the frequency-divided count value corresponding to the current selection clock among the frequency-divided count values S101 to S10n. The output select circuit 30 switches the clock output as the output signal OUT from the current selection clock to the next selection clock according to the switch of the value of the output select signal SEL. Accordingly, the clock switch circuit 1 is able to switch the cycle of the output signal OUT while preventing deviation of the pulse width of the clock and occurrence of a glitch.

In the clock switch circuit 1 according to the first exemplary embodiment, the frequency divide circuit 10 generates the frequency-divided clocks C101 to C10n without interruption. Thus, these frequency-divided clocks C101 to C10n can be supplied to other circuits (not shown) that are not controlled by the clock frequency through the output terminals DC01 to DCOn. The frequency-divided clocks C101 to C10n output from the frequency divide circuit 10 may not be supplied to other circuits.

[Second Exemplary Embodiment]

Figure 5:
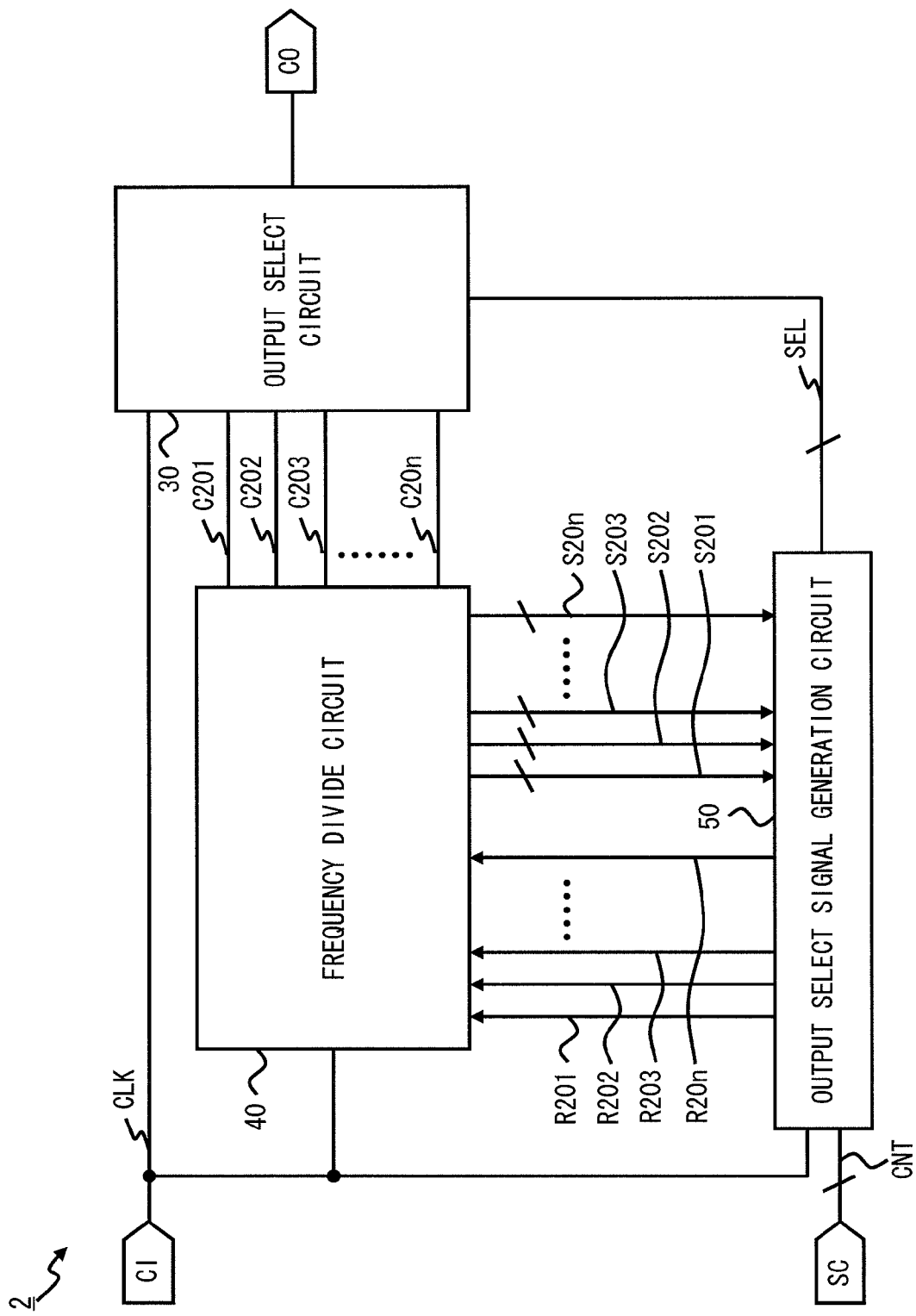
FIG. 5 is a block diagram showing a clock switch circuit according to a second exemplary embodiment.

FIG. 5 shows a block diagram of a clock switch circuit 2 according to a second exemplary embodiment. As shown in FIG. 5, the clock switch circuit 2 includes a frequency divide circuit 40 having a different form from that of the frequency divide circuit 10, and an output select signal generation circuit 50 having a different form from that of the output select signal generation circuit 20 of the clock switch circuit 1 according to the first exemplary embodiment. In the description of the clock switch circuit 2 according to the second exemplary embodiment, the same components as those of the clock switch circuit 1 according to the first exemplary embodiment will be denoted by the same reference symbols, and description thereof will be described.

The frequency divide circuit 40 generates a plurality of frequency-divided clocks based on the basic clock CLK and a plurality of frequency-divided count values corresponding to the plurality of frequency-divided clocks. The frequency divide circuit 40 further receives a plurality of reset signals R201 to R20n corresponding to the plurality of frequency-divided count values from the output select signal generation circuit 50. The frequency divide circuit 40 resets the frequency-divided count value corresponding to the reset signal that is asserted among the reset signals R201 to R20n.

Figure 6:
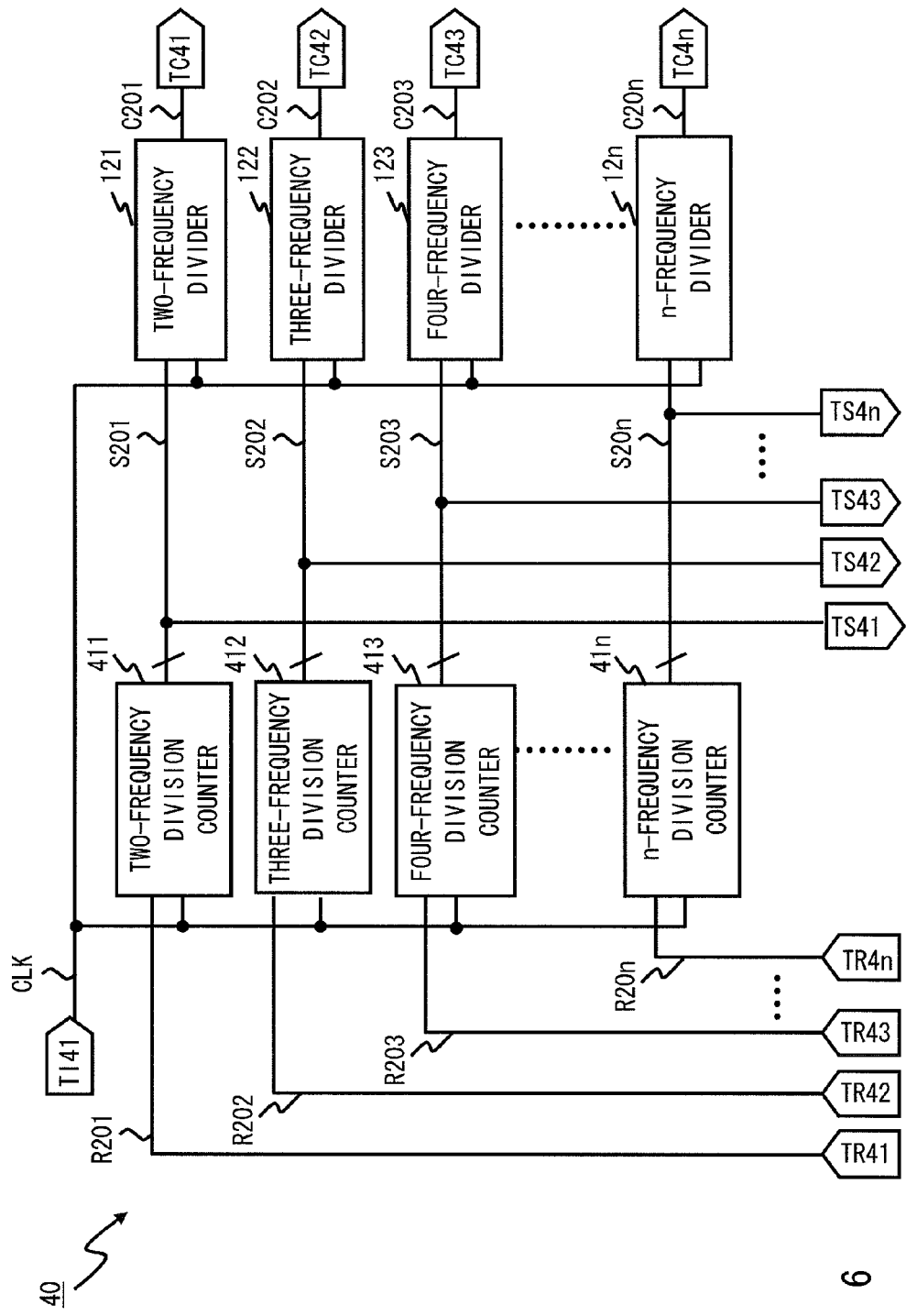
FIG. 6 is a block diagram showing a frequency divide circuit according to the second exemplary embodiment.

FIG. 6 shows a block diagram of the frequency divide circuit 40. As shown in FIG. 6, the frequency divide circuit 40 includes frequency division counters 411 to 41n, and frequency dividers 121 to 12n. The frequency dividers 121 to 12n are equal to the frequency dividers 121 to 12n shown in FIG. 2. The frequency division counters 411 to 41n are provided corresponding to the frequency dividers 121 to 12n. The frequency division counters 411 to 41n receive the basic clock CLK and the reset signals R201 to R20n, and output the frequency-divided count values S201 to S20n. The frequency division counters 411 to 41n count the number of clocks of the basic clock CLK. Further, when any one of the reset signals R201 to R20n is asserted, the frequency division counter to which the asserted reset signal is input resets the frequency-divided count value. The frequency division counters 411 to 41n output the count values that are substantially the same to those of the frequency division counters 111 to 11n in the first exemplary embodiment, and reset the frequency-divided count value according to the reset signals R201 to R20n.

In the frequency divide circuit 40 shown in FIG. 6, input terminals TI41, TR41 to TR4n, output terminals TS41 to TS4n, and output terminals TC41 to TC4n are shown. The input terminal TI41 is a terminal that inputs the basic clock CLK. The input terminals TR41 to TR4n are terminals that input the reset signals R201 to R20n. The output terminals TS41 to TS4n are terminals that output the frequency-divided count values S201 to S20n. The output terminals TC41 to TC4n are terminals that output frequency-divided clocks C201 to C20n. The frequency-divided clocks C201 to C20n in the second exemplary embodiment are substantially similar to the frequency-divided clocks C101 to C10n according to the first exemplary embodiment, but are different in that the frequency-divided clocks C201 to C20n have a period in which a cycle is different from that in other periods according to the reset of the frequency-divided count values S201 to S20n by the reset signals R201 to R20n.

Figure 7:
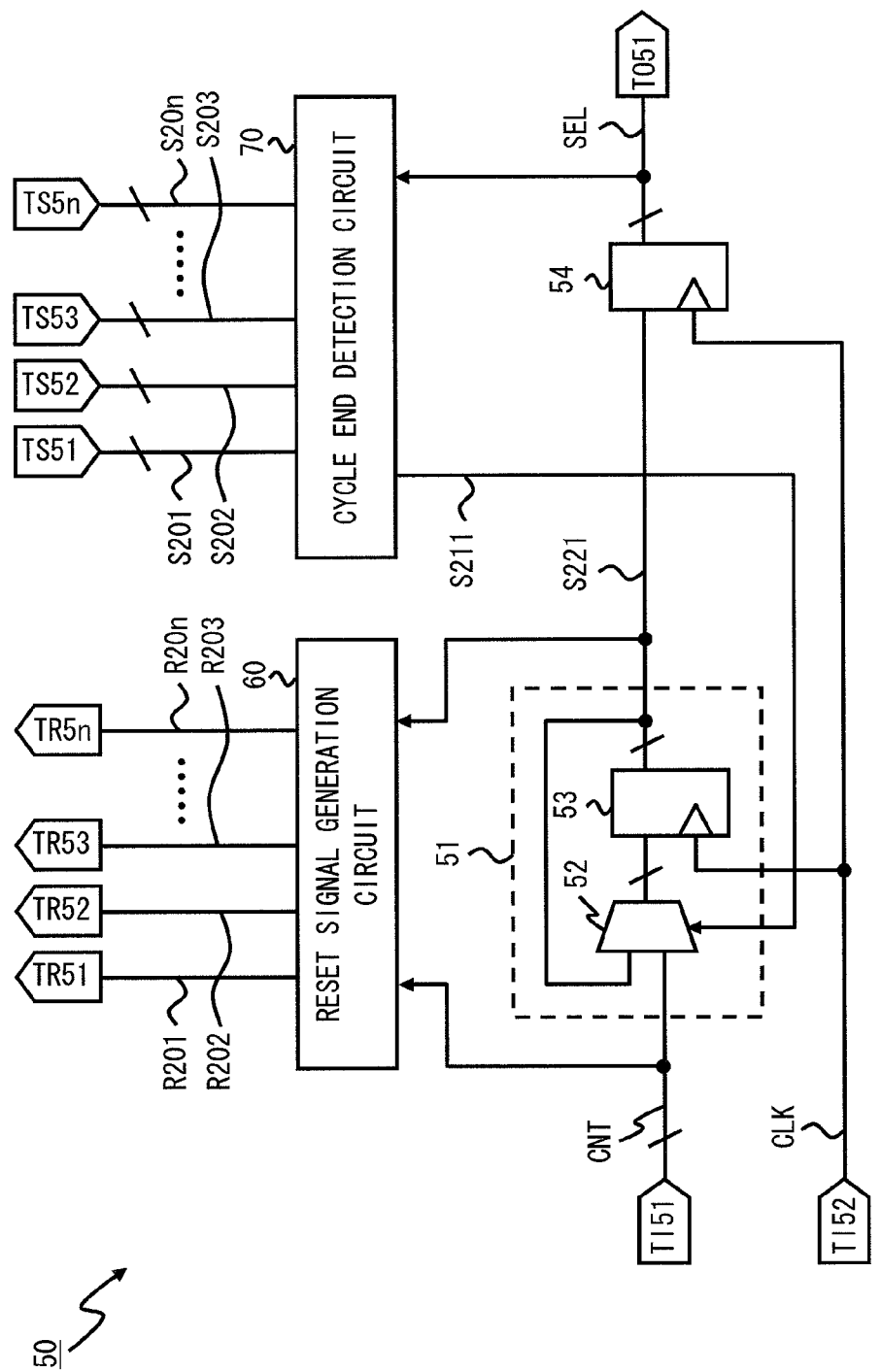
FIG. 7 is a block diagram showing an output select signal generation circuit according to the second exemplary embodiment.

The output select signal generation circuit 50 generates the reset signals R201 to R20n and the output select signal SEL based on the clock select signal CNT, the basic clock CLK, and the frequency-divided count values S201 to S20n. FIG. 7 shows a block diagram of the output select signal generation circuit 50. As shown in FIG. 7, the output select signal generation circuit 50 includes a notice signal switch circuit 51, a latch circuit 54, a reset signal generation circuit 60, and a cycle end detection circuit 70.

The notice signal switch circuit 51 switches the value of a next cycle clock notice signal 5221 that notices the frequency-divided clock after switching the cycle of the output signal OUT. More specifically, the notice signal switch circuit 51 sets the value of the clock select signal CNT as the value of the next cycle clock notice signal based on a cycle end signal S211 output from the cycle end detection circuit 70.

The notice signal switch circuit 51 includes a selector 52 and a flip-flop circuit 53. The selector 52 has one input terminal to which the clock select signal CNT is input, and the other input terminal to which the next cycle clock notice signal S221 is input. Further, the selector 52 is supplied with the cycle end signal S211 as the select signal. The selector 52 outputs the clock select signal CNT during the time at which the cycle end signal S211 is asserted, and outputs the next cycle clock notice signal S221 when the cycle end signal S211 is negated. The flip-flop circuit 53 receives the value of the signal output from the selector 52 in synchronization with the rising edge of the basic clock CLK and outputs the received value as the next cycle clock notice signal S221. In summary, the notice signal switch circuit 51 replaces the value of the next cycle clock notice signal S221 with the value of the clock select signal CNT based on the assert of the cycle end signal S211.

The latch circuit 54 receives the value of the next cycle clock notice signal S221 output from the notice signal switch circuit 51 in synchronization with the rising edge of the basic clock CLK, and outputs the received value as the output select signal SEL.

Figure 8:
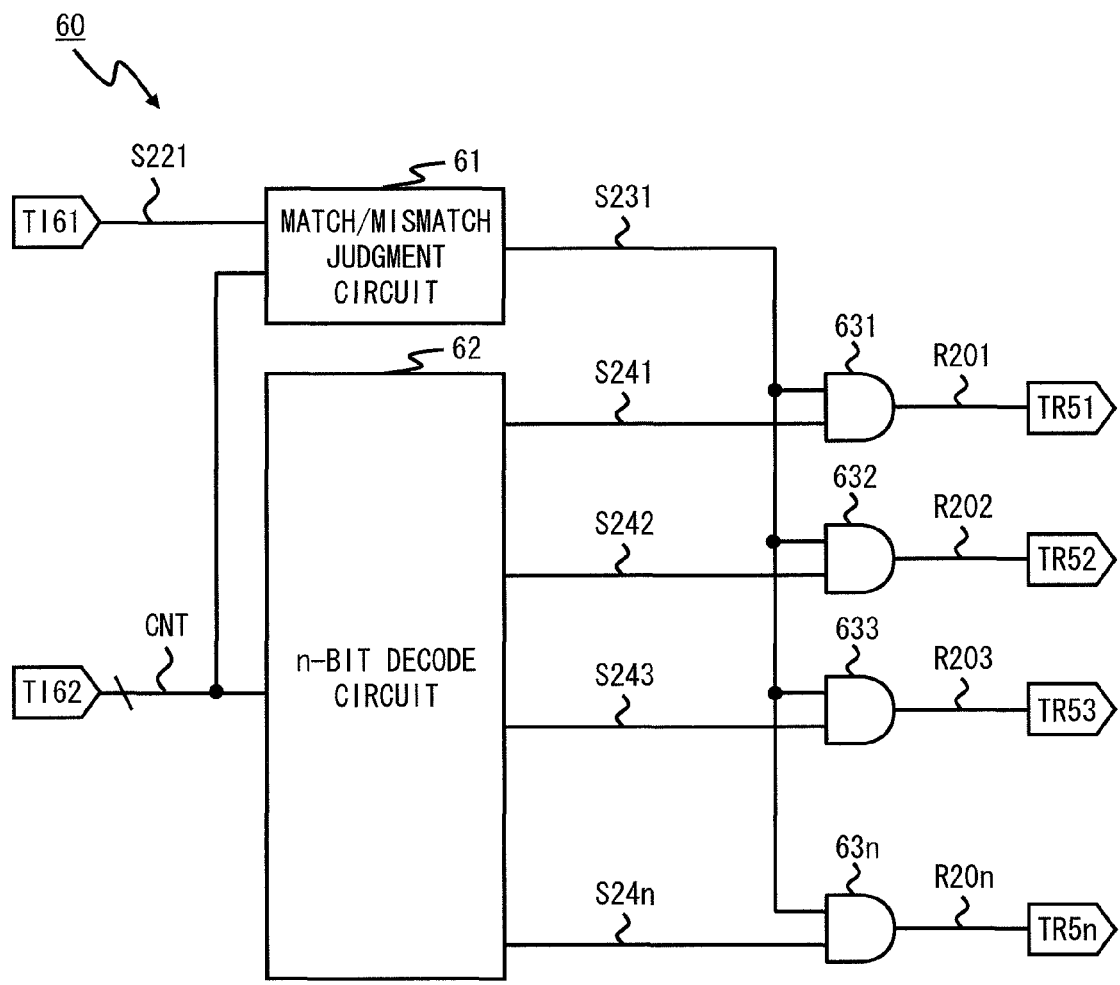
FIG. 8 is a block diagram showing a reset signal generation circuit according to the second exemplary embodiment.

The reset signal generation circuit 60 asserts the reset signal corresponding to the next selection clock based on the value of the clock select signal CNT and the value of the next cycle clock notice signal S221. FIG. 8 shows a block diagram of the reset signal generation circuit 60. As shown in FIG. 8, the reset signal generation circuit 60 includes a match/mismatch judgment circuit 61, an n-bit decode circuit 62, and gating circuits (AND circuits 631 to 63n, for example).

The match/mismatch judgment circuit 61 judges whether the value of the clock select signal CNT matches the value of the next cycle clock notice signal S221, and asserts a gating signal S231 when the two values are matched. The n-bit decode circuit 62 outputs a plurality of decode signals S241 to S24n corresponding to each of the plurality of frequency-divided clocks C201 to C20n (or the plurality of frequency division counters 411 to 41n). The n-bit decode circuit 62 decodes the value of the clock select signal CNT, asserts the decode signal corresponding to the next selection clock, and negates other decode signals. The AND circuits 631 to 63n output the decode signals S241 to S24n as the reset signals R201 to R20n while the gating signal is asserted. FIG. 8 shows input terminals TI61, TI62, and output terminals TR51 to TR5n. The input terminal TI61 is a terminal that inputs the next cycle clock notice signal S221 to the reset signal generation circuit 60. The input terminal TI62 is a terminal that inputs the clock select signal CNT to the reset signal generation circuit 60. The output terminals TR51 to TR5n are shown in FIG. 7, and output the reset signals R201 to R20n. These terminals are merely provided for the sake of convenience, and may be omitted.

The cycle end detection circuit 70 detects the end timing of one cycle of the current selection clock to assert the cycle end signal S211. More specifically, the cycle end detection circuit 70 recognizes the current selection clock based on the output select signal SEL. The cycle end detection circuit 70 then asserts the cycle end detection circuit 70 upon detection of the maximum count value of the frequency-divided count value corresponding to the current selection clock.

The output select signal generation circuit 50 shown in FIG. 7 includes input terminals TI51, TI52, TS51 to TS5n, and output terminals TR51 to TR5n, TO51. The input terminal TI51 is a terminal that inputs the clock select signal CNT. The input terminal TI52 is a terminal that inputs the basic clock CLK. The input terminals TS51 to TS5n are terminals that input the frequency-divided count values S201 to S20n. The output terminals TR51 to TR5n are terminals that output the reset signals R201 to R20n. The output terminal TO51 is a terminal that outputs the output select signal SEL. Although the input/output terminals of the output select signal generation circuit 50 are shown in FIG. 7 for the sake of convenience, these terminals may be omitted.

Figure 9:
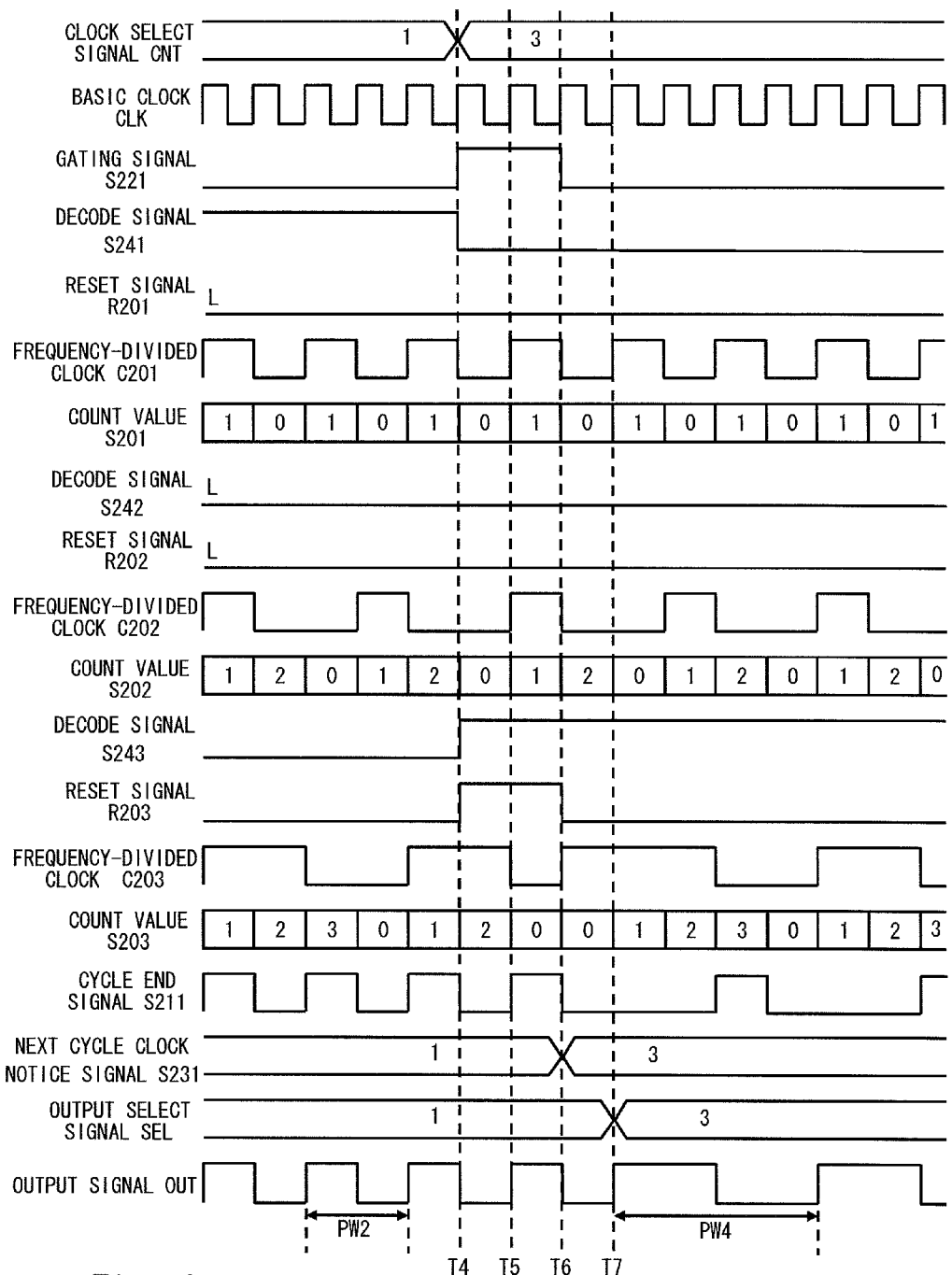
FIG. 9 is a timing chart showing the operation of the clock switch circuit according to the second exemplary embodiment.

Next, the operation of the clock switch circuit 2 according to the second exemplary embodiment will be described. FIG. 9 is a timing chart showing the operation of the clock switch circuit 2 according to the second exemplary embodiment. In the timing chart shown in FIG. 9, the value of the clock select signal CNT is switched from one to three at timing T4, and the cycle of the frequency-divided clock output as the output signal OUT is switched at timing T7.

In the example shown in FIG. 9, before timing T4, the value of the clock select signal CNT is 1, and the two-frequency-divided clock C201 is selected as the current selection clock. Thus, the notice signal switch circuit 51 shown in FIG. 7 outputs the value indicating the two-frequency-divided clock C201 as the next cycle clock notice signal S221. The cycle end detection circuit 70 asserts the cycle end signal S211 at the timing at which the two-frequency-divided count value becomes one (maximum count value of the two-frequency-divided count value) before timing T4. Further, before timing T4, the current selection clock and the next selection clock are both two-frequency-divided clock C201, and thus the match/mismatch judgment circuit 61 of the reset signal generation circuit 60 negates the gating signal S231. Accordingly, the reset signal generation circuit 60 keeps the state in which the reset signals R201 to R20n are negated before timing T4.

At timing T4, the value indicated by the clock select signal CNT is switched from one to three. Thus, switching of the output signal OUT from the two-frequency-divided clock C201 to the four-frequency-divided clock C203 is instructed to the clock switch circuit 2. According to the switch of the clock select signal CNT, the value of the next cycle clock notice signal S221 and the value of the clock select signal CNT input to the reset signal generation circuit 60 are different each other. Hence, in the reset signal generation circuit 60, the gating signal S231 is asserted. Further, the decode signal S243 corresponding to the four-frequency-divided clock among the decode signals output from the n-bit decode circuit 62 is asserted. Thus, the reset signal R203 corresponding to the four-frequency-divided clock is asserted.

The next basic clock CLK is input to the frequency divide circuit 40 at timing T5. The four-frequency division counter 413 of the frequency divide circuit 40 resets the count value based on the basic clock CLK input at timing T5. At timing T5, only the reset signal that is asserted is R203 corresponding to the four-frequency-divided clock, and thus the frequency division counters other than the four-frequency division counter 413 continue to transit the frequency-divided count values. Further, at timing T5, the two-frequency-divided count value S201 becomes one (maximum count value of the two-frequency-divided count value), and thus the cycle end signal S211 is asserted. As the cycle end signal S211 is asserted, the selector 52 shown in FIG. 7 sets the signal to be output to the clock select signal CNT. Further, as the four-frequency-divided count value S203 at timing T4 to T5 is two, the four-frequency-divided clock C203 becomes low level based on the basic clock CLK input at timing t5.

Subsequently, at timing T6, the next basic clock CLK is input. The reset signal R203 corresponding to the four-frequency-divided clock is asserted at timing T5 to T6, and thus the four-frequency division counter 413 keeps the four-frequency-divided count value 5203 as the minimum count value (initial value) at timing T6. On the other hand, in the notice signal switch circuit 51, the flip-flop circuit 53 switches the value of the next cycle clock notice signal S221 from one to three according to the rising of the basic clock CLK at timing T6. Then, the value of the next cycle clock notice signal S221 is equal to the value of the clock select signal CNT. Thus, the two values input to the reset signal generation circuit 60 are matched, and the reset signal generation circuit 60 negates the gating signal S231 and negates the reset signals R201 to R203. Further, since the four-frequency-divided count value S203 at timing T5 to T6 is zero, the four-frequency-divided clock C203 becomes high level based on the basic clock CLK input at timing T6.

Subsequently, at timing T7, the next basic clock CLK is input. At timing T7, the latch circuit 54 shown in FIG. 7 switches the value of the output select signal SEL according to the value of the next cycle clock notice signal S221 before timing T7. Thus, the value of the output select signal SEL matches the value of the clock select signal CNT. The output select circuit 30 then switches the frequency-divided clock output as the output signal OUT from the two-frequency-divided clock to the four-frequency-divided clock.

The switch operation of the output signal OUT at timing T7 will be described. At timing T6 to T7, the value of the output select signal SEL is 1, and the logic level at the start of the cycle of the two-frequency-divided clock (low level, for example) is output as the output signal OUT. On the other hand, at timing T6 to T7, the four-frequency-divided clock C203 selected as the frequency-divided clock after switch operation is high level based on the frequency-divided count value S203. However, both of the two-frequency-divided count value S201 and the four-frequency-divided count value before and after timing T7 transit from zero to one, and thus both of the two-frequency-divided clock C201 and the four-frequency-divided clock C203 perform the same state transition (transition of logic level). Hence, a glitch and so on are not produced in switching the cycles of the output signal OUT at timing T7. In the example shown in FIG. 9, one cycle of the output signal OUT is PW2, which is twice as long as one cycle of the basic clock CLK before timing T7, and one cycle of the output signal OUT is PW4, which is four times as long as one cycle of the basic clock CLK after timing T7.

From the above description, the clock switch circuit 2 according to the second exemplary embodiment initializes the logic level of the frequency-divided clock selected as the next selection clock and the frequency-divided count value corresponding to the next selection clock upon detection that the next selection clock becomes different from the current selection clock, and switches the clock to be output to the clock having a different cycle according to the end timing of the current selection clock detected based on the frequency-divided count value of the current selection clock.

Thus, in the clock switch circuit 2, the cycle of the output signal OUT can be switched according to the end timing of the cycle of the frequency-divided clock before switch operation regardless of the cycle of the frequency-divided clock after switch operation. In short, in the clock switch circuit 2, the switch operation of the clock can be performed in high speed than the clock switch circuit 1 according to the first exemplary embodiment.

Also in the clock switch circuit 2, the start timing of the frequency-divided clocks before and after the switch operation can be matched, thereby suppressing deviation of the pulse width and occurrence of a glitch according to the cycle switch operation. Further, the switch operation of the clock is performed based on the frequency-divided count value also in the clock switch circuit 2 according to the second exemplary embodiment, as is similar to the first exemplary embodiment. Thus, any clock cycle may be switched.

[Third Exemplary Embodiment]

Figure 10:
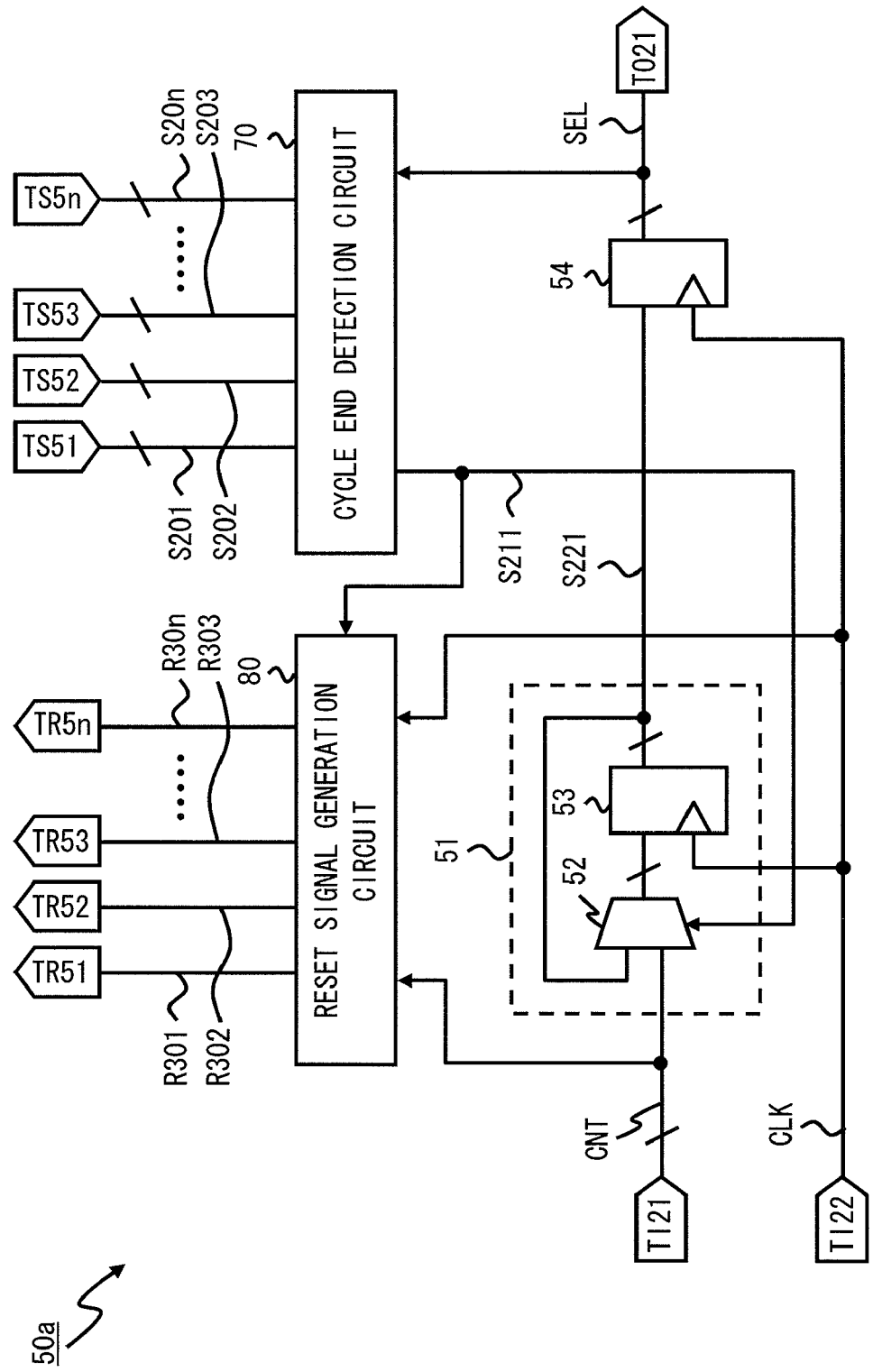
FIG. 10 is a block diagram showing an output select signal generation circuit according to a third exemplary embodiment.

A clock switch circuit according to a third exemplary embodiment has a form different from that of the reset signal generation circuit 60 according to the second exemplary embodiment. The whole block diagram of the clock switch circuit according to the third exemplary embodiment is similar to that of the clock switch circuit 2 shown in FIG. 5, and thus description will be omitted. FIG. 10 shows a block diagram of an output select signal generation circuit 50a including a reset signal generation circuit 80 having a form different from that of the reset signal generation circuit 60. In the description of the clock switch circuit according to the third exemplary embodiment, the same components as those of the clock switch circuits in the first and second exemplary embodiments are denoted by the same reference symbols, and description thereof will be omitted.

Figure 11:
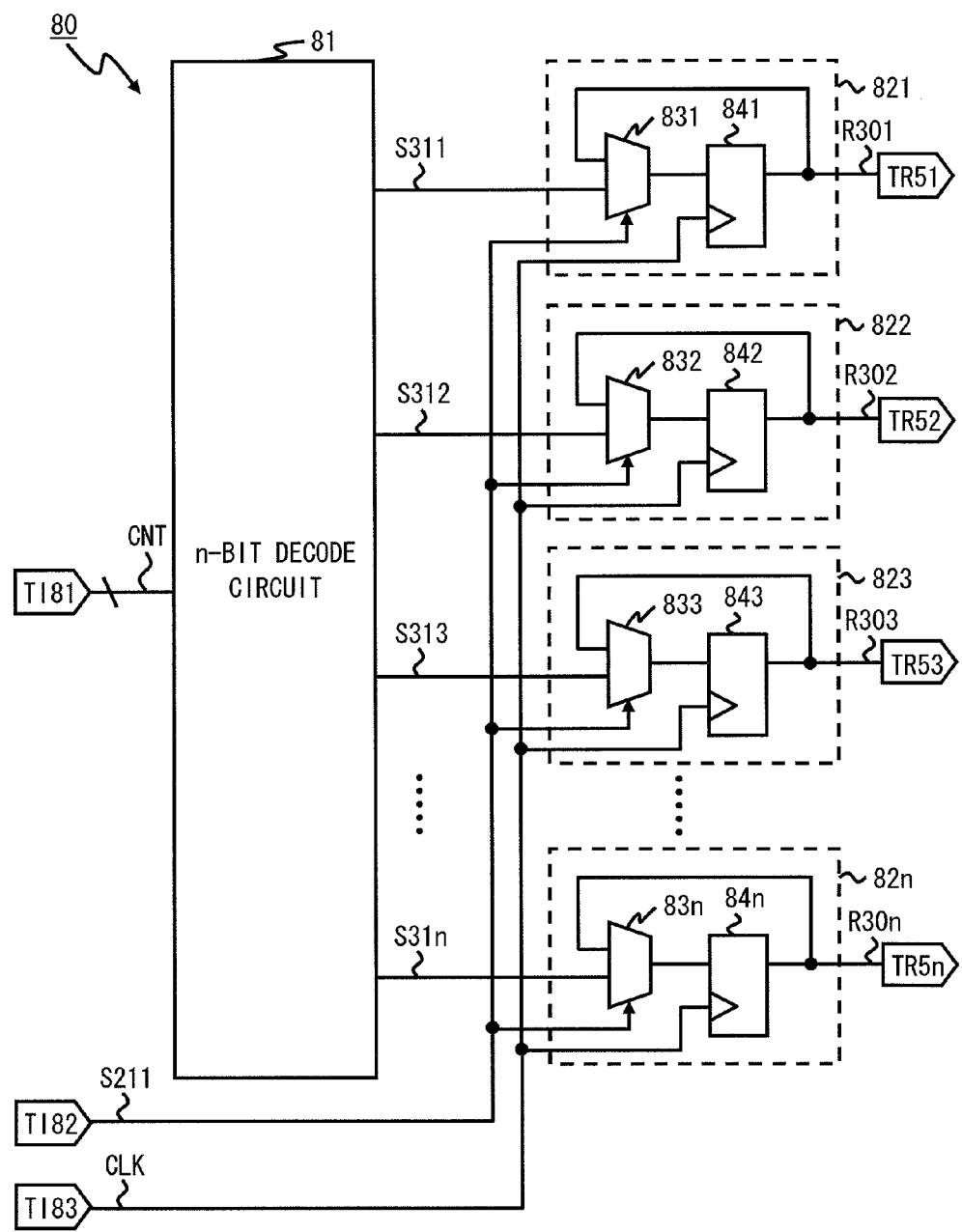
FIG. 11 is a block diagram showing a reset signal generation circuit according to the third exemplary embodiment.

As shown in FIG. 10, the output select signal generation circuit 50a includes a reset signal generation circuit 80 in place of the reset signal generation circuit 60. The reset signal generation circuit 80 asserts or negates a plurality of reset signals R301 to R30n corresponding to each of the plurality of frequency-divided clocks C203 to C20n based on the clock select signal CNT, the basic clock CLK, and the cycle end signal S211. The reset signals R301 to R30n are output to the frequency divide circuit 40. The reset signals R301 to R30n are substantially the same as the reset signals R201 to R20n in the second exemplary embodiment, but the reset signals R301 to R30n are different from R201 to R20n in terms of the period of being asserted or negated. FIG. 11 shows a block diagram of the reset signal generation circuit 80.

As shown in FIG. 11, the reset signal generation circuit 80 includes an n-bit decode circuit 81, and reset signal switch circuits 821 to 82n. The n-bit decode circuit 81 outputs a plurality of decode signals S311 to S31n corresponding to each of the plurality of frequency-divided clocks C201 to C20n (or plurality of frequency division counters 411 to 41n). The n-bit decode circuit 81 then decodes the value of the clock select signal CNT, negates the decode signal corresponding to the next selection clock, and asserts other decode signals.

The reset signal switch circuits 821 to 82n include selectors 831 to 83n and flip-flop circuits 841 to 84n. The reset signal switch circuits 821 to 82n are provided corresponding to the plurality of reset signals R301 to R30n. Thus, the reset signal switch circuits 821 to 82n have the identical structures. Now, the reset signal switch circuit will be described taking the reset signal switch circuit 821 as an example.

The reset signal switch circuit 821 includes a selector 831 and a flip-flop circuit 841. The selector 831 has one input terminal to which the decode signal S311 is input, and the other input terminal to which the reset signal R301 is input. Further, the selector 831 receives the cycle end signal S211 as the select signal. The selector 831 then outputs the decode signal S311 during a period at which the cycle end signal S211 is asserted, and outputs the reset signal R301 during a period at which the cycle end signal S211 is negated. The flip-flop circuit 841 receives the value of the signal output from the selector 831 in synchronization with the rising edge of the basic clock CLK and outputs the received value as the reset signal R301. In short, the reset signal switch circuit 821 replaces the value of the reset signal R301 with the value of the decode signal S311 based on the assert of the cycle end signal S211.

Figure 12:
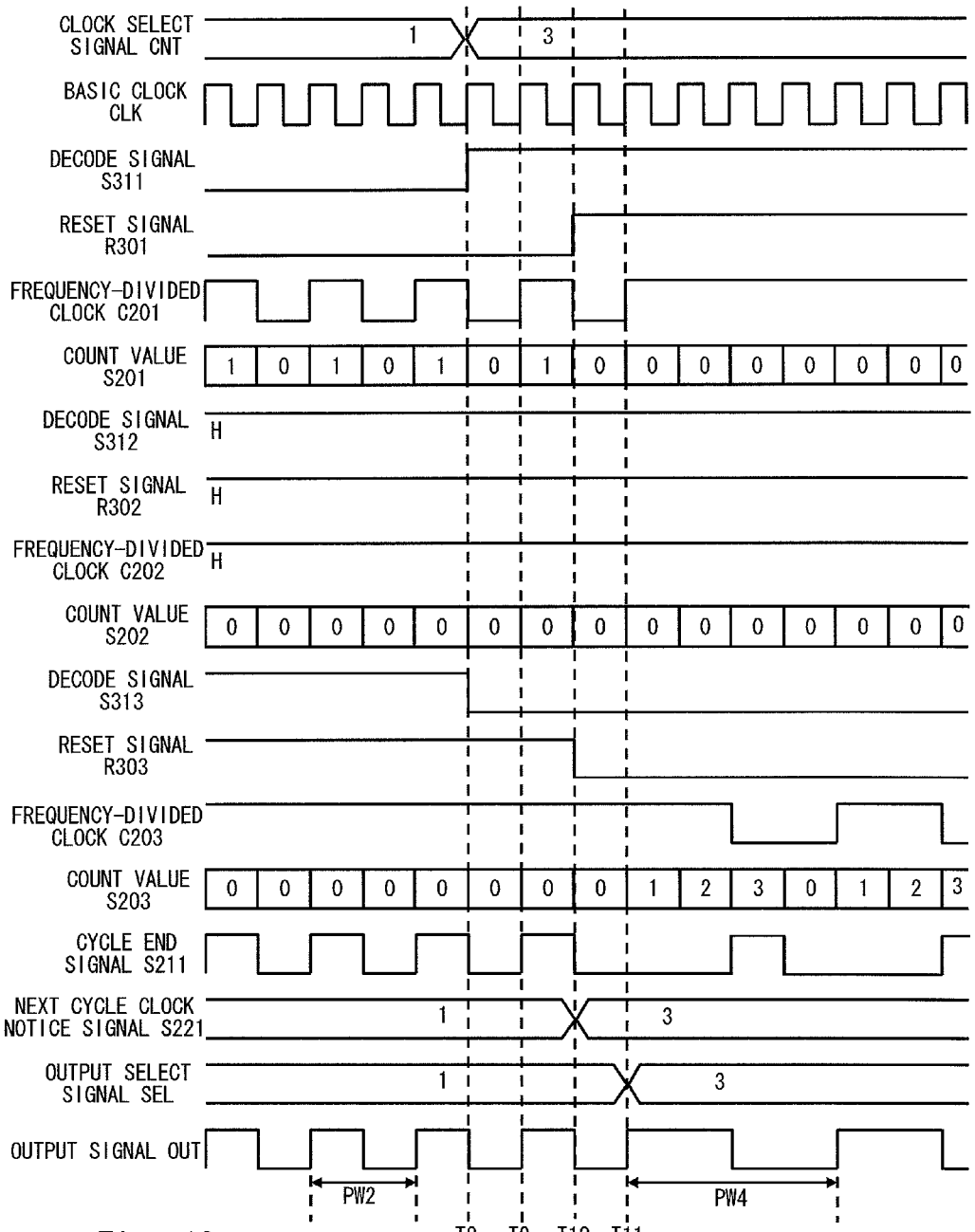
FIG. 12 is a timing chart showing the operation of a clock switch circuit according to the third exemplary embodiment.

Next, the operation of the clock switch circuit according to the third exemplary embodiment will be described. FIG. 12 shows a timing chart showing the operation of the clock switch circuit according to the third exemplary embodiment. In the timing chart shown in FIG. 12, the value of the clock select signal CNT is switched from one to three at timing T8, and the cycle of the frequency-divided clock output as the output signal OUT is switched at timing T11.

First, in the example shown in FIG. 12, before timing T8, the value of the clock select signal CNT is one, and the two-frequency-divided clock C201 is selected as the current selection clock. Thus, the notice signal switch circuit 51 shown in FIG. 10 outputs the value indicating the two-frequency-divided clock C201 as the next cycle clock notice signal S221. Further, the cycle end detection circuit 70 asserts the cycle end signal S211 at a timing at which the two-frequency-divided count value becomes one (maximum count value of the two-frequency-divided count value) before timing T8. Before timing T8, the value of the clock select signal CNT is one, and thus the n-bit decode circuit 81 of the reset signal generation circuit 80 negates the decode signal S311 corresponding to the two-frequency-divided clock C201 and asserts other decode signals. Further, before timing T8, even when the cycle end signal S211 is asserted, the decode signals S311 to S31n are not changed. Thus, the reset signal R301 is kept to be negated and the other reset signals are kept to be asserted. Thus, in the example shown in FIG. 12, before timing T8, the frequency-divided count values S202 and S203 are kept to be zero (minimum count value or initial value), and the frequency-divided clocks C202, C203 keep high level.

At timing T8, the value shown by the clock select signal CNT is switched from one to three. Thus, the clock switch circuit is instructed to switch the output signal OUT from the two-frequency-divided clock C201 to the four-frequency-divided clock C203. According to the switch of the clock select signal CNT, the n-bit decode circuit 81 of the reset signal generation circuit 80 asserts the decode signal S311 corresponding to the two-frequency-divided clock C201 and negates the decode signal S313 corresponding to the four-frequency-divided clock C203.

At timing T9, the next basic clock CLK is input to the frequency divide circuit 40. Based on the basic clock CLK input at timing T9, the two-frequency division counter 411 of the frequency divide circuit 40 sets the frequency-divided count value 5201 to one. According to the increase of the frequency-divided count value, the cycle end detection circuit 70 detects the end timing of the two-frequency-divided clock C201 and asserts the cycle end signal S211. Then, based on the assert of the cycle end signal S211, the selector 831 of the reset signal switch circuit 821 outputs the decode signal S311 that is asserted. Further, based on the assert of the cycle end signal S211, the selector 833 of the reset signal switch circuit 823 outputs the decode signal S313 that is negated. Further, based on the assert of the cycle end signal S211, the selector 52 shown in FIG. 10 sets the signal that is to be output as the clock select signal CNT.

Subsequently, the next basic clock CLK is input at timing T10. At timing T10, the values of the decode signals output from the selectors 831 to 833 at timing T9 are received by the flip-flop circuits 841 to 843, respectively, so as to update the reset signals R301 to R303. Thus, the reset signal R301 corresponding to the two-frequency-divided clock C201 is asserted, and the reset signal R303 corresponding to the four-frequency-divided clock C203 is negated. Further, in the notice signal switch circuit 51, the flip-flop circuit 53 switches the value of the next cycle clock notice signal S221 from one to three according to the rising of the basic clock CLK at timing T10. Further, at timing T10, the reset signal R301 is asserted, and thus the two-frequency division counter 411 stops the operation. According to the stop of the operation of the two-frequency division counter 411, the two-frequency-divided clock C201 keeps high level. On the other hand, at timing T10, the reset signal R303 is negated, and thus the four-frequency division counter 413 starts the operation. After that, the four-frequency-divided clock C203 is generated.

Subsequently, the next basic clock CLK is input at timing T11. According to the rising of the basic clock CLK input at timing T11, the latch circuit 54 shown in FIG. 10 switches the value of the output select signal SEL according to the value of the next cycle clock notice signal S221 before timing T11. Thus, the value of the output select signal SEL matches the value of the clock select signal CNT. The output select circuit 30 then switches the frequency-divided clock output as the output signal OUT from the two-frequency-divided clock to the four-frequency-divided clock.

From the above description, in the clock generation circuit according to the third exemplary embodiment, only one frequency-divided clock which is the output target is generated according to the clock select signal CNT. Thus, in the clock switch circuit according to the third exemplary embodiment, it is possible to reduce power consumption for generating the frequency-divided clock which is not output as the output signal OUT. The switching operation of the frequency-divided clock in the clock switch circuit according to the third exemplary embodiment is substantially equal to that of the clock switch circuit 2 according to the second exemplary embodiment, and thus deviation of the pulse width and occurrence of a glitch according to the switch operation can be prevented. Further, also in the clock switch circuit according to the third exemplary embodiment, the switching operation of the clocks is performed based on the frequency-divided count value in the same way as in the first exemplary embodiment, thereby switches any clock cycle.

The first to third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

For example, when zero is specified as the clock select signal CNT, the basic clock CLK may be output as the output signal OUT. The clock switch circuit according to the present invention is operated with reference to the basic clock CLK. Thus, when the basic clock CLK is output as the output signal OUT, the frequency-divided count value corresponding to the basic clock CLK may always be considered as zero.

What is claimed is:

1. A clock switch circuit comprising:
a frequency divide circuit which divides a frequency of a basic clock to generate a plurality of frequency-divided clocks having different frequency dividing ratios;
an output select signal generation circuit which outputs an output select signal according to a clock select signal having a value indicating a clock which is to be output, the output select signal specifying any one of a plurality of clocks including the plurality of frequency-divided clocks and the basic clock; and
an output select circuit which selects any one of the plurality of clocks according to the output select signal to output the selected clock, wherein
the frequency divide circuit outputs a plurality of frequency-divided count values corresponding to each of the plurality of frequency-divided clocks, the plurality of frequency-divided count values indicating the number of clocks of the basic clock from start of one cycle of each of the frequency-divided clocks, and
the output select signal generation circuit switches a value of the output select signal to a value corresponding to the clock select signal at a timing at which start timing of a cycle of a frequency-divided clock selected as a next selection clock matches start timing of a cycle of a frequency-divided clock corresponding to a current selection clock based on a frequency-divided count value corresponding to the current selection clock among the plurality of frequency-divided count values.

2. The clock switch circuit according to claim 1, wherein the frequency divide circuit comprises:
a plurality of frequency division counters, each of which counting the basic clock and generating a frequency-divided count value of corresponding frequency-divided clock; and
a plurality of frequency dividers that generate the frequency-divided clocks based on the frequency-divided count value output from a corresponding frequency division counter among the plurality of frequency division counters.

3. The clock switch circuit according to claim 2, wherein each of the frequency division counters includes a minimum count value and a maximum count value based on a frequency dividing ratio of a corresponding frequency-divided clock, and cyclically increases the frequency-divided count value between the minimum count value and the maximum count value.

4. The clock switch circuit according to claim 1, wherein the output select signal generation circuit comprises:
a switch timing detection circuit that outputs a timing notification signal at a timing at which start timing of a current selection clock matches start timing of a next selection clock based on the frequency-divided count value of the current selection clock and the frequency-divided count value of the next selection clock; and
an output select signal switch circuit that switches a value of the output select signal based on the timing notification signal.

5. The clock switch circuit according to claim 1, wherein the output select signal generation circuit comprises:
a cycle end detection circuit which detects an end timing of one cycle of a current selection clock to assert a cycle end signal;
a notice signal switch circuit which outputs a value of the clock select signal as a next cycle clock notice signal according to the cycle end signal;
a latch circuit which outputs a value of the next cycle clock notice signal as the output select signal based on the basic clock; and
a reset signal generation circuit which asserts a reset signal corresponding to the next selection clock based on the value of the clock select signal and the value of the next cycle clock notice signal, wherein
the frequency divide circuit sets a logical level of the frequency-divided clock and the frequency-divided count value corresponding to the reset signal that is asserted to initial values.

6. The clock switch circuit according to claim 5, wherein the reset signal generation circuit comprises:
a decode circuit which decodes the value of the clock select signal to assert a decode signal corresponding to the next selection clock and negate other decode signals;
a match/mismatch judgment circuit which asserts a gating signal when the value of the clock select signal matches the value of the next cycle clock notice signal; and
a gating circuit which outputs the decode signal as the reset signal during a period at which the gating signal is asserted.

7. The clock switch circuit according to claim 5, wherein the reset signal generation circuit comprises:
- a decode circuit which decodes the value of the clock select signal to negate a decode signal corresponding to the next selection clock and assert other reset signals; and
- a reset signal switch circuit that sets the value of the decode signal as the value of the reset signal based on the cycle end signal and the basic clock.

8. A clock switch method of a clock switch circuit, the clock switch circuit outputting clock signals having different cycles by switching the clock signals, the method comprising:
- generating a plurality of frequency-divided clocks having different frequency dividing ratios based on a basic clock;
- generating a plurality of frequency-divided count values indicating the number of clocks of the basic clock from a start point of one cycle of each of the plurality of frequency-divided clocks;
- detecting one of end timing and start timing of a cycle of a current selection clock based on a frequency-divided count value corresponding to the current selection clock among the plurality of frequency-divided count values; and
- switching a clock which is output to a clock having a different cycle at a timing at which start timing of a cycle of the frequency-divided clock selected as a next selection clock matches start timing of a next cycle of a frequency-divided clock corresponding to the current selection clock.

9. The clock switch method according to claim 8, comprising:
- detecting that the frequency-divided count value corresponding to the current selection clock is set to an initial value; and
- switching a clock which is output to a clock having a different cycle upon detection that both of the frequency-divided count value corresponding to the current selection clock and the frequency-divided count value corresponding to the next selection clock are set to initial values.

10. The clock switch method according to claim 8, comprising:
- upon detection that the next selection clock is different from the current selection clock, initializing a logic level of a frequency-divided clock selected as the next selection clock and a frequency-divided count value corresponding to the next selection clock; and
- switching a clock which is output to a clock having a different cycle according to the end timing of the current selection clock detected based on the frequency-divided count value of the current selection clock.

11. The clock switch method according to claim 10, wherein the plurality of frequency-divided clocks are in stop states when not selected.

* * * * *